(12) United States Patent
Lee et al.

(10) Patent No.: US 12,159,867 B2
(45) Date of Patent: Dec. 3, 2024

(54) SEMICONDUCTOR DEVICE WITH HIGH-RESISTANCE POLYSILICON RESISTOR FORMATION METHOD

(71) Applicant: SK keyfoundry Inc., Cheongju-si (KR)

(72) Inventors: Heuiseung Lee, Cheongju-si (KR); Jungmun Jung, Cheongju-si (KR)

(73) Assignee: SK keyfoundry Inc., Cheongju-si (KR)

( * ) Notice: Subject to any disclaimer, the term of this patent is extended or adjusted under 35 U.S.C. 154(b) by 463 days.

(21) Appl. No.: 17/575,224

(22) Filed: Jan. 13, 2022

(65) Prior Publication Data
US 2022/0406771 A1    Dec. 22, 2022

(30) Foreign Application Priority Data
Jun. 17, 2021   (KR) .......................... 10-2021-0078602

(51) Int. Cl.
*H01L 27/06* (2006.01)
*H01L 29/66* (2006.01)
*H01L 29/78* (2006.01)
*H01L 49/02* (2006.01)

(52) U.S. Cl.
CPC .......... *H01L 27/0629* (2013.01); *H01L 28/20* (2013.01); *H01L 29/66689* (2013.01); *H01L 29/7817* (2013.01)

(58) Field of Classification Search
CPC ........... H01L 29/66492; H01L 29/6659; H01L 29/7833; H01L 27/0629; H01L 28/20
See application file for complete search history.

(56) References Cited

U.S. PATENT DOCUMENTS

| 7,241,663 | B2 | 7/2007 | Howard et al. |
| 7,691,718 | B2 | 4/2010 | Park et al. |
| 8,853,764 | B1 | 10/2014 | Zhang et al. |
| 10,535,651 | B2 | 1/2020 | Wen et al. |
| 2006/0234439 | A1* | 10/2006 | Howard .................. H01L 28/20 257/E27.047 |
| 2015/0187583 | A1* | 7/2015 | Montgomery ...... H01L 27/0629 438/238 |

FOREIGN PATENT DOCUMENTS

JP    2001168207 A  *  6/2001
JP    2008-538454 A     10/2008

OTHER PUBLICATIONS

Korean Office Action issued on Apr. 27, 2023, in counterpart Korean Patent Application No. 10-2021-0078602 (5 pages in Korean).

* cited by examiner

*Primary Examiner* — Raj R Gupta
(74) *Attorney, Agent, or Firm* — NSIP Law (57) ABSTRACT

A semiconductor device polysilicon resistor formation method is provided. A third ion implantation and a fourth ion implantation are performed in a polysilicon resistor region, so that a high-resistance polysilicon resistor can be formed without an additional mask process.

16 Claims, 9 Drawing Sheets

SEMICONDUCTOR DEVICE WITH HIGH-RESISTANCE POLYSILICON RESISTOR FORMATION METHOD

CROSS-REFERENCE TO RELATED APPLICATIONS

This application claims the benefit under 35 USC § 119(a) of Korean Patent Application No. 10-2021-0078602, filed on Jun. 17, 2021, the entire disclosure of which is incorporated herein by reference for all purposes.

BACKGROUND

1. Field

The following description relates to a semiconductor device with a high resistance polysilicon resistor (or polysilicon resistor) formation method.

2. Description of Related Art

Generally, unlike a digital semiconductor device which has signals with only two states of high and low, in an analog semiconductor device, resistors and capacitors may be added to each node of a circuit that stores information in various states. When a resistance value of the resistor and a capacitance value of the capacitor vary greatly according to the change in voltage, defects may occur.

A typical high-resistance polysilicon resistor formation method implements a mask process that is beneficial in achieving a high resistance. That is, only a high-resistance polysilicon resistor region may be exposed on undoped polysilicon through a photomask process, and ions may be implanted at a low concentration to form a high-resistance polysilicon resistor.

However, the typical high-resistance polysilicon resistor formation method has disadvantages that a mask may be additionally desired, and such patterning process and ion implantation process may be additionally desired, so that the process cost may increase.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a high-resistance polysilicon resistor formation method includes forming a first isolation, a second isolation and a third isolation in a substrate; forming a first gate electrode between the first isolation and the second isolation; forming a second gate electrode between the second isolation and the third isolation; forming a polysilicon pattern over the third isolation; forming a first mask pattern which exposes the first gate electrode, and covers the second gate electrode and the polysilicon pattern; performing a first ion implantation process to form a P-type well region under the first gate electrode with the first mask pattern; removing the first mask pattern; forming a second mask pattern which exposes the second gate electrode, and covers the first gate electrode and the polysilicon pattern; performing a second ion implantation process to form a N-type well region under the second gate electrode with the second mask pattern; removing the second mask pattern; forming sidewall spacers on sidewalls of the polysilicon pattern; forming a third mask pattern which exposes the first gate electrode and the polysilicon pattern, and covers the second gate electrode; performing a third ion implantation process with N-type dopants on the polysilicon pattern with the third mask pattern, wherein N-type source and drain regions are formed in the P-type well region through the third ion implantation process; removing the third mask pattern; forming a fourth mask pattern which exposes the second gate electrode and the polysilicon pattern, and covers the first gate electrode; performing a fourth ion implantation process with P-type dopants on the polysilicon pattern with the fourth mask pattern, wherein P-type source and drain regions are formed in the N-type well region by the fourth ion implantation process, and the implanted N-type dopants in the polysilicon pattern are compensated by the implanted P-type dopants to form the high-resistance polysilicon resistor; and removing the fourth mask pattern.

A depth of the N-type well region under the second gate electrode may be smaller than a depth of the N-type well region under the P-type source region and the P-type drain region.

A depth of the P-type well region under the first gate electrode may be less than a depth of the P-type well region under the N-type source region and the N-type drain region.

The high-resistance polysilicon resistor may have a higher resistance than a resistance of the first gate electrode or a resistance of the second gate electrode.

The method may further include forming a silicide blocking insulating on a first portion of the polysilicon pattern; and forming silicide layers on a second portion of the polysilicon pattern.

The polysilicon pattern may be configured to have a same thickness as a thickness of the first gate electrode or a thickness of the second gate electrode.

The P-type well region may be in direct contact with the N-type well region under the second isolation region.

In a general aspect, a high-resistance polysilicon resistor formation method includes forming a first gate electrode, a second gate electrode and a polysilicon pattern; performing a first ion implantation process to form a P-type well region under the first gate electrode with a first mask pattern; performing a second ion implantation process to form a N-type well region under the second gate electrode with a second mask pattern; performing a third ion implantation process with N-type dopants on the polysilicon pattern with a third mask pattern, wherein N-type source and drain regions are formed in the P-type well region through the third ion implantation process; and performing a fourth ion implantation with P-type dopants on the polysilicon pattern with a fourth mask pattern, wherein P-type source and drain regions are formed in the N-type well region by the fourth ion implantation process, and the implanted N-type dopants in the polysilicon pattern are compensated by the implanted P-type dopants to form the high-resistance polysilicon resistor.

The first mask pattern may expose the first gate electrode, and cover the second gate electrode and the polysilicon pattern, the second mask pattern may expose the second gate electrode, and cover the first gate electrode and the polysilicon pattern, the third mask pattern may expose the first gate electrode and the polysilicon pattern, and cover the second gate electrode, and the fourth mask pattern may exposes the second gate electrode and the polysilicon pattern, and cover the first gate electrode.

The performing of the first ion implantation process may include forming a N-type lightly doped drain (N-LDD) region in the P-type well region; and forming a first Halo region disposed adjacent to the N-LDD region.

A depth of the P-type well region under the first gate electrode may be less than a depth of the P-type well region which does not overlap the first gate electrode.

The performing of the second ion implantation process may include forming a P-type Lightly doped drain (P-LDD) region in the N-type well region; and forming a second Halo region disposed adjacent to the P-LDD region.

A depth of the N-type well region under the second gate electrode may be less than a depth of the N-type well region which does not overlap the second gate electrode.

The third ion implantation process may be performed with N-type dopants having an energy of 40 keV to 70 kEV at a concentration of $4e15/cm^{-2}$ to $7e15/cm^{-2}$, and the fourth ion implantation process is performed with P-type dopants having an energy of 4 keV to 10 kEV at a concentration of $2e15/cm^{-2}$ to $4e15/cm^{-2}$.

In a general aspect, a high-resistance polysilicon resistor formation method includes forming a first electrode in a NMOS region of a substrate; forming a second electrode in a PMOS region of the substrate; forming a polysilicon pattern in a high-resistance polysilicon resistor region of the substrate; forming a first mask pattern to expose the first electrode and cover the second electrode and the polysilicon pattern; performing a first ion implantation process on the NMOS region; forming a second mask pattern to expose the second electrode, and cover the first electrode and the polysilicon pattern; performing a second ion implantation process on the opened PMOS region; forming a third mask pattern to expose the first electrode and the polysilicon pattern, and cover the second electrode; performing a third ion implantation process to implant N-type dopants into the NMOS region and the high-resistance polysilicon resistor region; forming a fourth mask pattern to expose the second gate electrode and the polysilicon pattern, and covers the first gate electrode; and performing a fourth ion implantation process to implant P-type dopants into the PMOS region and the high-resistance polysilicon resistor region.

The N-type dopants may be implanted with an energy of 40 keV to 70 kEV at a concentration of $4e15/cm^{-2}$ to $7e15/cm^{-2}$.

The P-type dopants may be implanted with an energy of 4 keV to 10 kEV at a concentration of $2e15/cm^{-2}$ to $4e15/cm^{-2}$.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known after an understanding of the disclosure of this application may be omitted for increased clarity and conciseness, noting that omissions of features and their descriptions are also not intended to be admissions of their general knowledge.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

The terminology used herein is for the purpose of describing particular examples only, and is not to be used to limit the disclosure. As used herein, the singular forms "a," "an," and "the" are intended to include the plural forms as well, unless the context clearly indicates otherwise. As used herein, the term "and/or" includes any one and any combination of any two or more of the associated listed items. As used herein, the terms "include," "comprise," and "have" specify the presence of stated features, numbers, operations, elements, components, and/or combinations thereof, but do not preclude the presence or addition of one or more other features, numbers, operations, elements, components, and/or combinations thereof.

In addition, terms such as first, second, A, B, (a), (b), and the like may be used herein to describe components. Each of these terminologies is not used to define an essence, order, or sequence of a corresponding component but used merely to distinguish the corresponding component from other component(s).

Unless otherwise defined, all terms, including technical and scientific terms, used herein have the same meaning as commonly understood by one of ordinary skill in the art to which this disclosure pertains and after an understanding of the disclosure of this application. Terms, such as those defined in commonly used dictionaries, are to be interpreted as having a meaning that is consistent with their meaning in the context of the relevant art and the disclosure of this application, and are not to be interpreted in an idealized or overly formal sense unless expressly so defined herein.

Also, in the description of example embodiments, detailed description of structures or functions that are thereby known after an understanding of the disclosure of the present application will be omitted when it is deemed that such description will cause ambiguous interpretation of the example embodiments.

Hereinafter, examples will be described in detail with reference to the accompanying drawings, and like reference numerals in the drawings refer to like elements throughout.

The one or more examples also relate to a polysilicon resistor (or polysilicon resistor) formation method for a semiconductor device, and more particularly to a high-resistance polysilicon resistor formation method even without an additional mask process.

FIGS. 1 to 9 illustrate cross sectional views for each process, and describe a high resistance polysilicon resistor formation method, in accordance with one or more embodiments.

Figure 1:
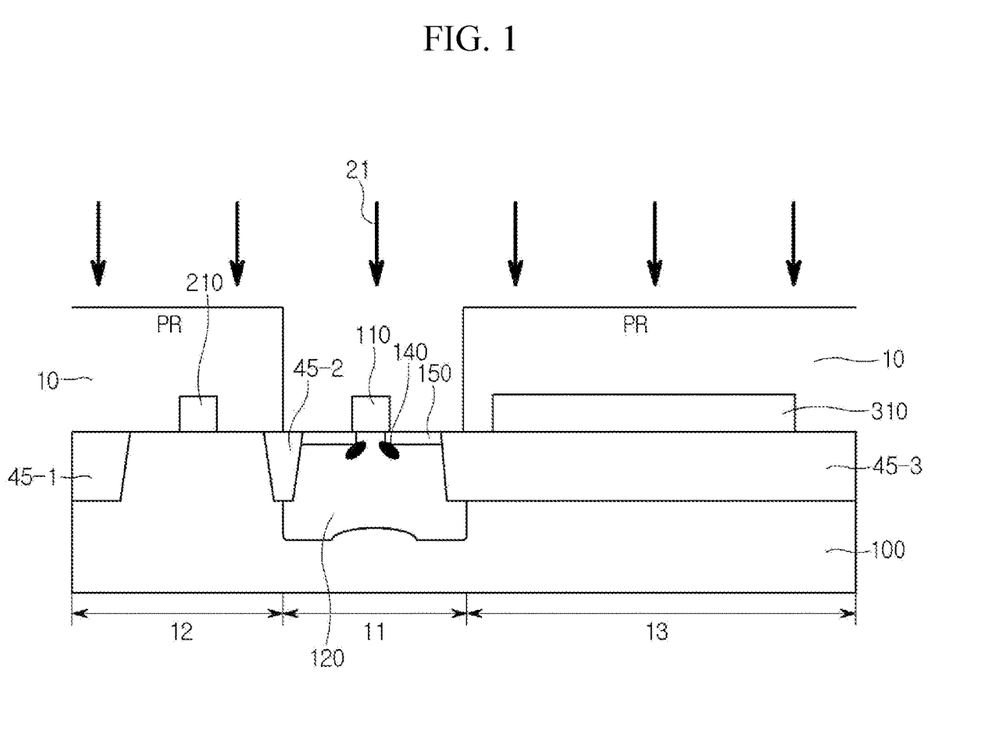
FIG. 1 illustrates a first ion implantation, in accordance with one or more embodiments.

FIG. 1 illustrates a first ion implantation, in accordance with one or more embodiments.

Referring to FIG. 1, an example semiconductor device, in accordance with one or more embodiments, includes an NMOS region 11, a PMOS region 12, and a high-resistance polysilicon resistor region (HR Polysilicon resistor) 13. Therefore, an NMOS transistor, a PMOS transistor, and a high-resistance polysilicon resistor may be respectively formed in the NMOS region 11, the PMOS region 12, and the high-resistance polysilicon resistor 13.

Shallow trench isolations (STI) 45-1 to 45-3 may be formed in a substrate 100. The shallow trench isolations (STI) 45-1 to 45-3 may also be replaced by LOCOS or junction isolation. In an example, the shallow trench isolations (STI) 45-1 to 45-3, LOCOS (not shown) and junction isolation (not shown) may be referred to as isolation regions. The shallow trench isolations (STI) 45-1 to 45-3 may comprise a first isolation 45-1, a second isolation 45-2, and a third isolation 45-3, starting from left to right in FIG. 1. A first gate electrode 110 may be formed between the third isolation 45-3 (right end) and the second isolation 45-2 (middle). A second gate electrode 210 may be formed between the second isolation 45-2 (middle) and the first isolation 45-1 (left end). A polysilicon pattern 310 may be formed over the third isolation 45-3 (right end). In an example, the third isolation 45-3 (right end) may have a longer length than a length of the first isolation 45-1 (left end) or the second isolation 45-2 (middle).

Subsequently, a gate insulating layer may be formed. Then, an undoped polysilicon layer (not shown) may be deposited on the gate insulating layer. The first gate electrode 110, the second gate electrode 210, and the polysilicon pattern 310 may be formed on the substrate 100 by using a gate photo mask (not shown) patterning process. The polysilicon pattern 310, in accordance with one or more embodiments, may be positioned on the STI 45-3 that is the field oxide film. The polysilicon pattern 310 may have a same thickness as a thickness of the first gate electrode 110 or the second gate electrode 210.

Referring to FIG. 1, a first mask pattern 10 is disposed on the substrate 100 on which the first gate electrode 110, the second gate electrode 210, and the polysilicon pattern 310 are disposed. The first mask pattern 10 may use a photoresist PR. The first mask pattern 10 opens or exposes the NMOS region 11. A first ion implantation process 21 may be performed on the opened NMOS region 11. The first ion implantation process 21 includes P-type well region ion implantation, NMOS Vt ion implantation, N-type lightly Doped Drain (N-LDD) ion implantation, and first Halo ion implantation. Four ion implantation processes with different energies and doses may be performed with one mask.

A P-type well region 120, a NMOS Vt ion implantation region (not shown), an N-LDD region 150, and a first Halo region 140 may be formed through the P-type well ion implantation, the NMOS Vt ion implantation, N-LDD ion implantation, and the first Halo ion implantation, respectively. The N-LDD region 150 and the first Halo region 140 may be formed in the P-type well region 120. Additionally, the NMOS Vt ion implantation region may be formed just below the first gate electrode 110 to adjust a threshold voltage of a NMOS device. The first Halo region 140 may be formed around the N-LDD region 150, and punch-through can be prevented through the first Halo region 140. The first Halo region 140 and the P-type well region 120 may have the same conductivity type.

The bottom surface of the P-type well region 120 may be uneven. This is because the first gate electrode 110 may be implemented as a mask when the P-type well ion implantation is performed. Dopants which have passed through the first gate electrode 110 have a smaller ion implantation depth. The remaining regions have a greater ion implantation depth. Therefore, the depth of the P-type well region 120 formed under the first gate electrode 110 is shallower than that of other regions.

During the first ion implantation process 21, ions may be implanted only into the NMOS region 11. Additionally, the PMOS region 12 and the high-resistance polysilicon resistor region 13 are covered by the photoresist PR 10.

Figure 2:
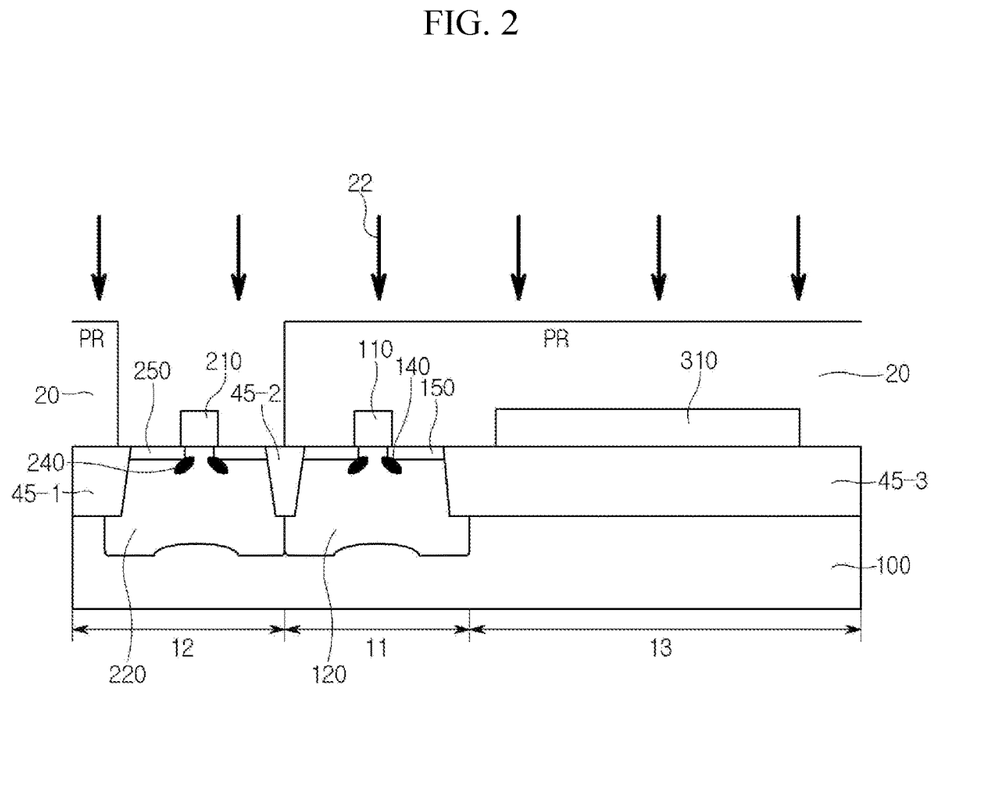
FIG. 2 illustrates a second ion implantation, in accordance with one or more embodiments.

FIG. 2 illustrates an example second ion implantation process, in accordance with one or more embodiments.

Referring to FIG. 2, a second mask pattern 20 may be formed on the substrate on which the first gate electrode 110, the second gate electrode 210, and the polysilicon pattern 310 are formed or disposed. The second mask pattern 20 uses the photoresist PR. The second mask pattern 20 opens the PMOS region 12. A second ion implantation process 22 is performed on the opened PMOS region 12. The second ion implantation process 22 includes N-type well region 220 ion implantation, PMOS Vt ion implantation, P-type Lightly Doped Drain (P-LDD) ion implantation, and second Halo ion implantation. Four ion implantation processes with different energies and doses may be performed with one mask.

An N-type well region 220, a PMOS Vt ion implantation region (not shown), a P-LDD region 250, and a second Halo region 240 may be formed through the N-type well ion implantation, the PMOS Vt ion implantation, P-LDD ion implantation, and the second Halo ion implantation, respectively. The P-LDD region 250 and the second Halo region 240 may be formed in the N-type well region 220. Additionally, the PMOS Vt ion implantation region may be formed just below the second gate electrode 210 to adjust a threshold voltage of a PMOS device. The second Halo region 240 may be formed around the P-LDD region 250, and punch-through can be prevented through the second Halo region 240. The second Halo region 240 and the N-type well region 220 may have the same conductivity type.

The bottom surface of the N-type well region 220 may also be uneven. This is because the second gate electrode 210 may be implemented as a mask when the N-type well ion implantation is performed. Dopants which have passed through the second gate electrode 210 may have a smaller ion implantation depth. The remaining regions have a greater ion implantation depth. Therefore, the depth of the N-type well region 220 formed under the second gate electrode 210 may be shallower than the depth of other regions. The N-type well region 220 may be in direct contact with the P-type well region 120 under the second isolation region 45-2.

During the second ion implantation process 22, ions may be implanted only into the PMOS region 12. Additionally, the NMOS region 11 and the high-resistance polysilicon resistor region 13 may be covered by the photoresist PR 20.

During the N-LDD ion implantation and P-LDD ion implantation, the high-resistance polysilicon resistor region 13 may be covered by the first and second mask patterns 10 and 20 in order to obtain stable resistance characteristics.

Figure 3:
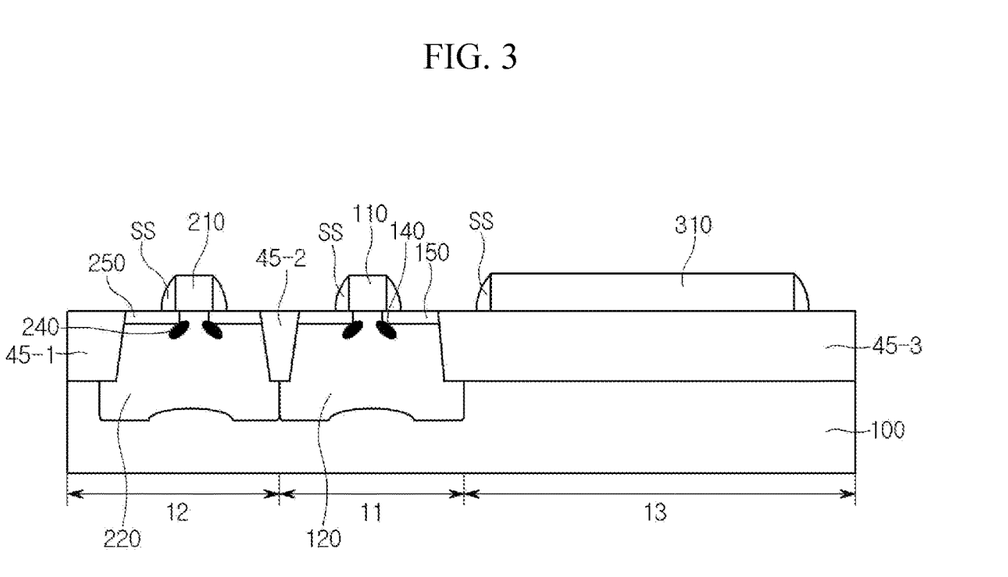
FIG. 3 illustrates an example process of forming a sidewall spacer, in accordance with one or more embodiments.

FIG. 3 shows an example process of forming a sidewall spacer, in accordance with one or more embodiments.

After the N-LDD ion implantation and P-LDD ion implantation of FIGS. 1 to 2, a first heat treatment may be performed. The first heat treatment may be performed by a rapid thermal annealing (RTA) process. In the first heat treatment, the RTA process may be performed to activate the ion-implanted dopants. The first heat treatment may be referred to as a first activation process. The RTA process may be an optional process. Additionally, sidewall spacers SS may be formed on sidewalls of the first gate electrode 110, the second gate electrode 210, and the polysilicon pattern 310, respectively.

Figure 4:
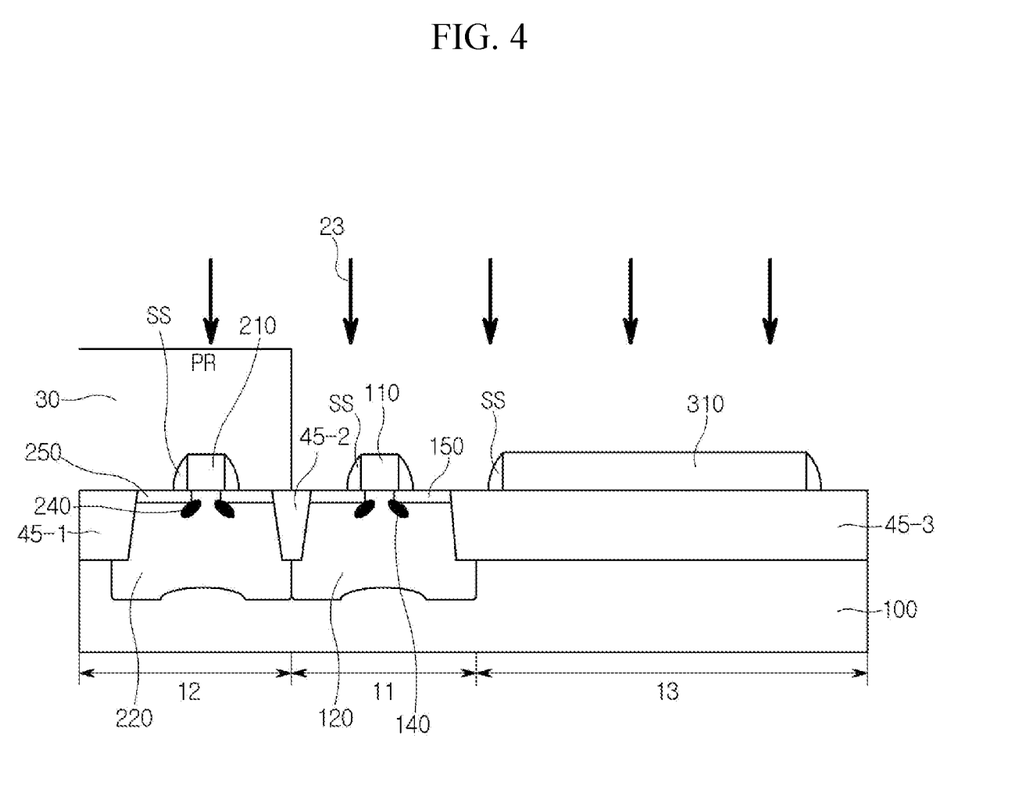
FIG. 4 illustrates a third ion implantation for the NMOS region and an HR polysilicon resistor region, in accordance with one or more embodiments.

FIG. 4 illustrates a third ion implantation for the NMOS region and an HR polysilicon resistor region, in accordance with one or more embodiments.

Referring to FIG. 4, a third mask pattern 30 may be formed such that the NMOS region 11 and the high-resistance polysilicon resistor region 13 are opened, and the PMOS region 12 is covered by the photoresist PR. The third mask pattern 30 uses the photoresist PR. A third ion implantation process 23 using N-type dopants may be performed to form first source and drain regions 160 (FIG. 5) in the NMOS region 11. The high-concentration N-type dopants may be implanted into the NMOS region 11 and the high-resistance polysilicon resistor region 13. Therefore, the high-concentration N-type dopants may be implanted into the first gate electrode 110 and the polysilicon pattern 310. In an example, the PMOS region 12 may be covered by the photoresist PR 30, so that the high-concentration N-type dopants are not implanted into the second gate electrode 210.

In the third ion implantation process 23, in accordance with one or more embodiments, the high-concentration N-type dopants may be implanted with an energy of 40 keV to 70 kEV at a concentration of $4e15/cm^{-2}$ to $7e15/cm^{-2}$.

It can be seen that the depth of the P-type well region 120 under the first gate electrode 110 may be smaller than the depth of the P-type well region under the first source and drain regions 160. This is because, as mentioned above, the P-type well region 120 may be formed by using the first gate electrode 110 as a mask.

Figure 5:
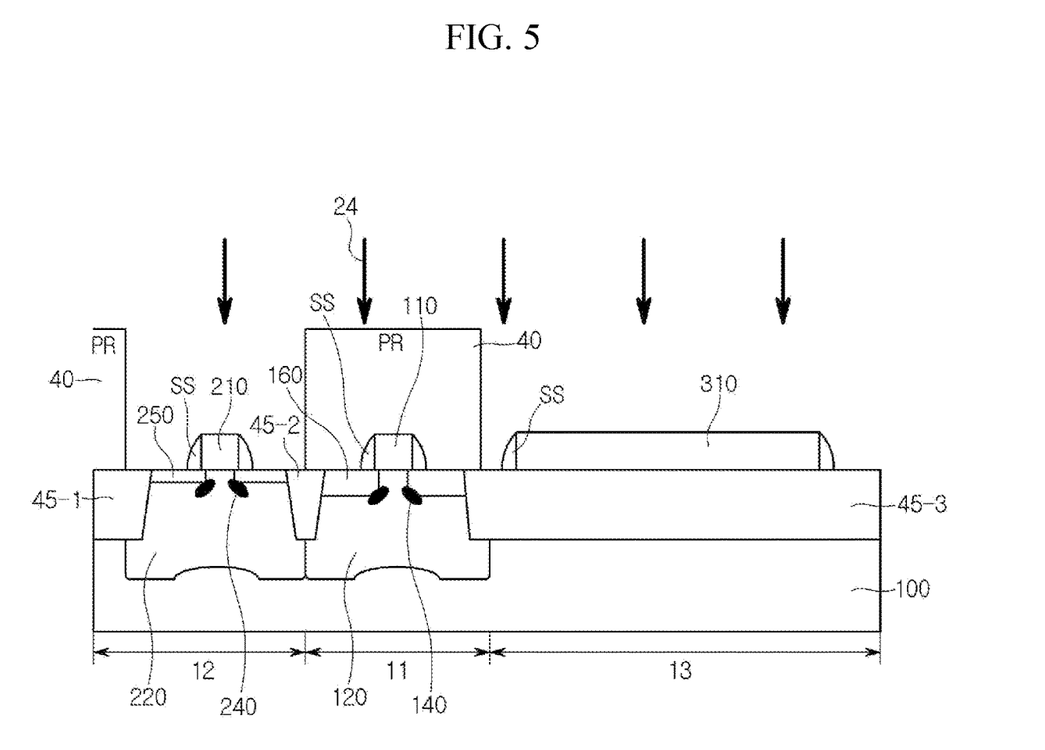
FIG. 5 illustrates a fourth ion implantation for the PMOS region and the HR polysilicon resistor region, in accordance with one or more embodiments.

FIG. 5 illustrates a fourth ion implantation for the PMOS region and the HR polysilicon resistor region, in accordance with one or more embodiments.

Referring to FIG. 5, a fourth mask pattern 40 may be formed such that the PMOS region 12 and the high-resistance polysilicon resistor region 13 are opened, and the NMOS region 11 is covered. The fourth mask pattern 40 uses the photoresist PR. A fourth ion implantation process 24 using P-type dopants may be performed to form second source and drain regions 260 (FIG. 6) in the PMOS region 12. The high-concentration P-type dopants may be implanted into the PMOS region 12 and the high-resistance polysilicon resistor region 13. Therefore, the second source and drain regions 260 may be formed on the substrate, around the second gate electrode 210. Additionally, the high-concentration P-type dopants may also be implanted into the second gate electrode 210 and the polysilicon pattern 310. Accordingly, the high-concentration N-type dopant and the high-concentration P-type dopants may be sequentially implanted into the polysilicon pattern 310. Additionally, the high-concentration P-type dopants may be implanted into the second gate electrode 210.

In an example, the NMOS region 11 is covered by the photoresist PR 40, so that the high-concentration P-type dopants are not implanted into the first gate electrode 110.

In the fourth ion implantation process 24, in accordance with one or more embodiments, the high-concentration P-type dopants may be implanted with an energy of 4 keV to 10 kEV at a concentration of $2e15/cm^{-2}$ to $4e15/cm^{-2}$.

It can be seen that the depth of the N-type well region 220 under the second gate electrode 210 may be less than the depth of the N-type well region 220 under the second source and drain regions 260. This is because, as mentioned above, the N-type well region 220 is formed by using the second gate electrode 210 as a mask.

Figure 6:
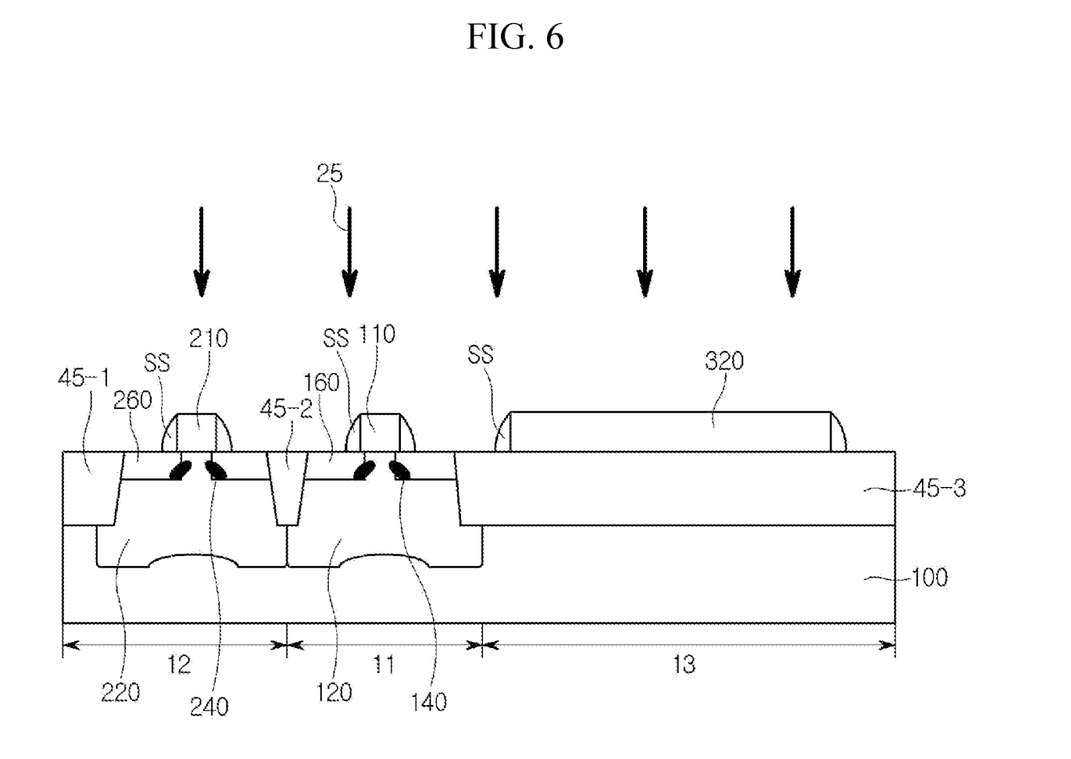
FIG. 6 illustrates a dopant activation process, in accordance with one or more embodiments.

FIG. 6 illustrates an example dopant activation process, in accordance with one or more embodiments.

Referring to FIG. 6, in order to activate the ion-implanted dopants after the ion implantation process, a second heat treatment process 25 may be performed. This may be referred to as a second activation process. This process completes doping the NMOS/PMOS transistor and the high-resistance polysilicon resistor.

The gate electrode 110 of the NMOS region 11 may be made of the polysilicon into which the N-LDD and the high-concentration N-type dopants have been implanted.

The gate electrode 210 of the PMOS region 12 may be made of the polysilicon into which the P-LDD and the high-concentration P-type dopants have been implanted.

Additionally, the polysilicon pattern 310 may be made of a high-resistance polysilicon resistor 320 which has a high sheet resistance of several thousand ohms/square by being ion-implanted with the high-concentration N-type dopants and the high-concentration P-type dopants. The resistance of the high-resistance polysilicon resistor 320 may be significantly higher than each resistance of the gate electrodes 110 and 210.

In the example, the third ion implantation and the fourth ion implantation may be performed at a uniform concentration throughout the entire high-resistance polysilicon resistor region 13 including a contact region. This may reduce the change in the resistance of the end of the high-resistance polysilicon resistor 320.

The one or more examples may include a feature that the high-concentration N-type dopants and the high-concentration P-type dopants may be implanted into the high-resistance polysilicon resistor region 13. The implanted N-type dopants are compensated by the implanted P-type dopants, so a net doping concentration of the high-resistance polysilicon resistor 320 may be decreased. Accordingly, the resistance of the high-resistance polysilicon resistor 320 has a higher resistance than that of the first gate electrode 110 or the second gate electrode 210. As such, in the one or more examples, the high-resistance polysilicon resistor 320 may be manufactured without adding the mask, photoresist, and ion implantation process.

Next, a method that forms a silicide layer at the end of the high-resistance polysilicon resistor will be described with reference to FIGS. 7 to 8. The high-resistance polysilicon resistor, in accordance with one or more embodiments, may reduce the contact resistance by forming a silicide layer at the end of the polysilicon resistor.

Figure 7:
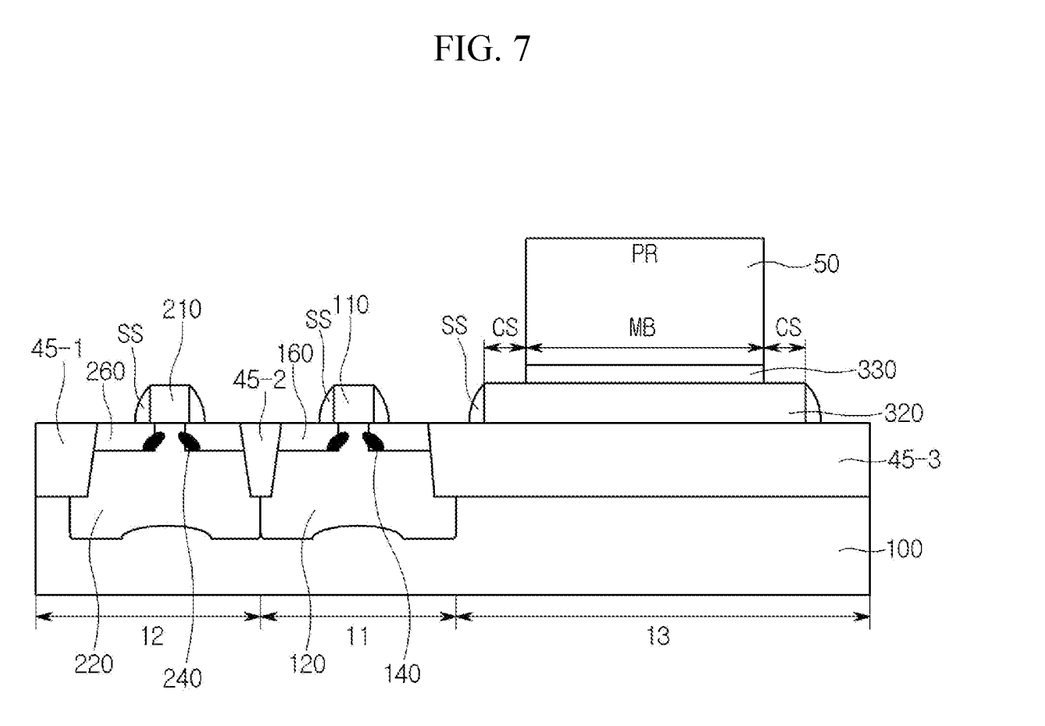
FIG. 7 illustrates an example process of forming a silicide blocking layer, in accordance with one or more embodiments.

FIG. 7 illustrates an example process of forming a silicide blocking pattern, in accordance with one or more embodiments.

Referring to FIG. 7, before the silicide layer is formed, a silicide blocking pattern 330 may be formed. The silicide blocking pattern 330 is formed by depositing the silicide blocking insulating layer on the entire surface of the substrate 100 and by etching using a fifth mask pattern 50. The silicide blocking insulating layer may be formed by using an oxide film, a nitride film, an oxynitride film (SiON), or the like. The fifth mask pattern 50 covers a large portion of the high-resistance polysilicon resistor 320 and opens a contact region CS. The 'MB' as illustrated in FIG. 7 denotes the large portion of the high-resistance polysilicon resistor 320. The silicide blocking pattern 330 exposes the contact region CS of the high-resistance polysilicon resistor 320 and blocks the 'MB' region of the high-resistance polysilicon resistor 320. The silicide region may be formed on the contact region CS, however, the MB region becomes non-silicide region.

Figure 8:
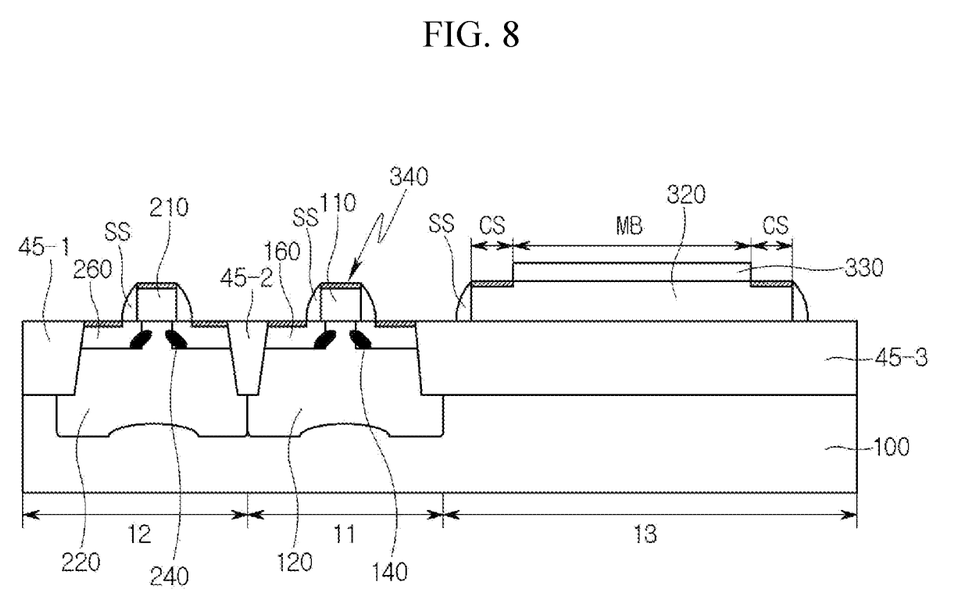
FIG. 8 illustrates an example process of forming a silicide layer, in accordance with one or more embodiments.

FIG. 8 illustrates an example silicide layer formation process, in accordance with one or more embodiments.

After the process of FIG. 7, a general self-aligned silicide (Salicide) process applied to semiconductors may be performed, so that the silicide layer 340 is, as shown in FIG. 8, formed in the gates 110 and 210 and source/drain regions 160 and 260 of the transistor and in the contact region CS of the polysilicon resistor. The silicide layer 340 may be formed to reduce the resistance of the gate and source/drain regions of the transistor and the resistance of the contact region of the polysilicon resistor. In the example, the silicide layer 340 may include CoSi2 or NiSi.

Figure 9:
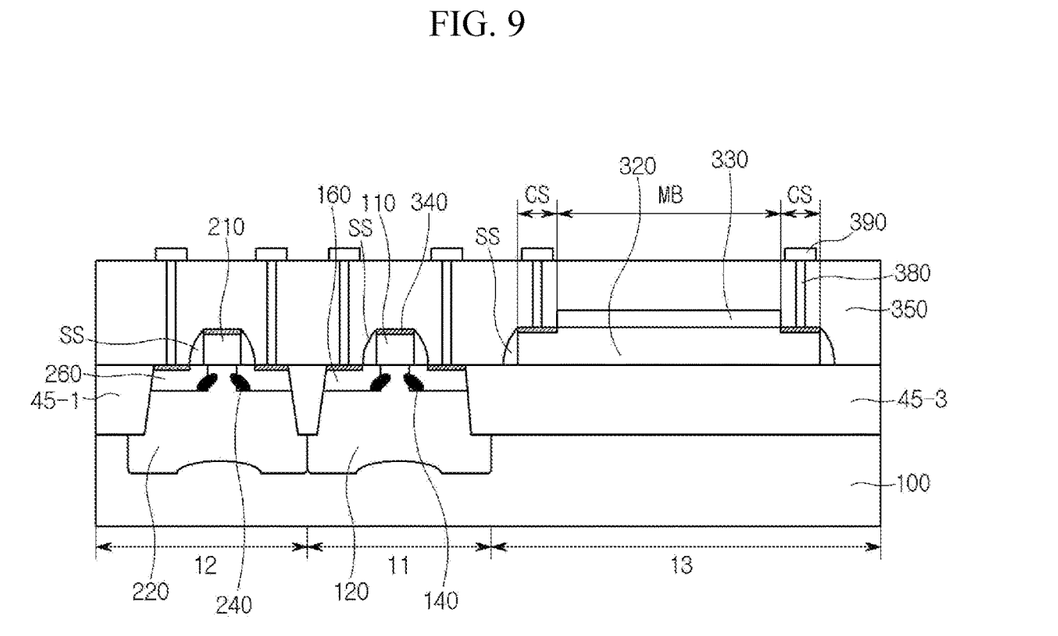
FIG. 9 illustrates an example process of forming a contact plug and a metal wiring, in accordance with one or more embodiments.

FIG. 9 illustrates an example contact plug and a metal wiring formation method, in accordance with one or more embodiments.

Referring to FIG. 9, an insulating layer 350 may be thickly deposited on the gate electrodes 110 and 210, the polysilicon resistor 320, and the silicide layer 340. Additionally, a contact hole may be formed in the insulating layer 350 through a contact hole patterning process. Additionally, a contact plug 380 may be formed by filling metal such as, but not limited to, tungsten or copper into the contact hole. Then, a metal wiring 390 connected to the contact plug 380 is formed.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure

What is claimed is:

1. A high-resistance polysilicon resistor formation method, the method comprising:
forming a first isolation, a second isolation and a third isolation in a substrate;
forming a first gate electrode between the first isolation and the second isolation;
forming a second gate electrode between the second isolation and the third isolation;
forming a polysilicon pattern over the third isolation;
forming a first mask pattern which exposes the first gate electrode, and covers the second gate electrode and the polysilicon pattern;
performing a first ion implantation process to form a P-type well region under the first gate electrode with the first mask pattern;
removing the first mask pattern;
forming a second mask pattern which exposes the second gate electrode, and covers the first gate electrode and the polysilicon pattern;
performing a second ion implantation process to form a N-type well region under the second gate electrode with the second mask pattern;
removing the second mask pattern;
forming sidewall spacers on sidewalls of the polysilicon pattern;
forming a third mask pattern which exposes the first gate electrode and the polysilicon pattern, and covers the second gate electrode;
performing a third ion implantation process with N-type dopants on the polysilicon pattern with the third mask pattern, wherein N-type source and drain regions are formed in the P-type well region through the third ion implantation process;
removing the third mask pattern;
forming a fourth mask pattern which exposes the second gate electrode and the polysilicon pattern, and covers the first gate electrode;
performing a fourth ion implantation process with P-type dopants on the polysilicon pattern with the fourth mask pattern, wherein P-type source and drain regions are formed in the N-type well region by the fourth ion implantation process, and the implanted N-type dopants in the polysilicon pattern are compensated by the implanted P-type dopants to form the high-resistance polysilicon resistor; and removing the fourth mask pattern.

2. The method of claim 1, wherein a depth of the N-type well region under the second gate electrode is smaller than a depth of the N-type well region under the P-type source region and the P-type drain region.

3. The method of claim 1, wherein a depth of the P-type well region under the first gate electrode is less than a depth of the P-type well region under the N-type source region and the N-type drain region.

4. The method of claim 1, wherein the high-resistance polysilicon resistor has a higher resistance than a resistance of the first gate electrode or a resistance of the second gate electrode.

5. The method of claim 1, further comprising:
forming a silicide blocking insulating on a first portion of the polysilicon pattern; and
forming silicide layers on a second portion of the polysilicon pattern.

6. The method of claim 1, wherein the polysilicon pattern is configured to have a same thickness as a thickness of the first gate electrode or a thickness of the second gate electrode.

7. The method of claim 1, wherein the P-type well region is in direct contact with the N-type well region under the second isolation region.

8. A high-resistance polysilicon resistor formation method, the method comprising:
forming a first gate electrode, a second gate electrode and a polysilicon pattern;
performing a first ion implantation process to form a P-type well region under the first gate electrode with a first mask pattern;
performing a second ion implantation process to form a N-type well region under the second gate electrode with a second mask pattern;
performing a third ion implantation process with N-type dopants on the polysilicon pattern with a third mask pattern, wherein N-type source and drain regions are formed in the P-type well region through the third ion implantation process; and
performing a fourth ion implantation with P-type dopants on the polysilicon pattern with a fourth mask pattern, wherein P-type source and drain regions are formed in the N-type well region by the fourth ion implantation process, and the implanted N-type dopants in the polysilicon pattern are compensated by the implanted P-type dopants to form the high-resistance polysilicon resistor,
wherein the first mask pattern exposes the first gate electrode, and covers the second gate electrode and the polysilicon pattern,
wherein the second mask pattern exposes the second gate electrode, and covers the first gate electrode and the polysilicon pattern,
wherein the third mask pattern exposes the first gate electrode and the polysilicon pattern, and covers the second gate electrode, and
wherein the fourth mask pattern exposes the second gate electrode and the polysilicon pattern, and covers the first gate electrode.

9. The method of claim 8, wherein the performing of the first ion implantation process comprises:
forming a N-type lightly doped drain (N-LDD) region in the P-type well region; and
forming a first Halo region disposed adjacent to the N-LDD region.

10. The method of claim 8, wherein a depth of the P-type well region under the first gate electrode is less than a depth of the P-type well region which does not overlap the first gate electrode.

11. The method of claim 8, wherein the performing of the second ion implantation process comprises:
forming a P-type Lightly doped drain (P-LDD) region in the N-type well region; and
forming a second Halo region disposed adjacent to the P-LDD region.

12. The method of claim 8, wherein a depth of the N-type well region under the second gate electrode is less than a depth of the N-type well region which does not overlap the second gate electrode.

13. The method of claim 8, wherein the third ion implantation process is performed with N-type dopants having an energy of 40 keV to 70 KEV at a concentration of $4e15/cm^{-2}$ to $7e15/cm^{-2}$, and
wherein the fourth ion implantation process is performed with P-type dopants having an energy of 4 keV to 10 KEV at a concentration of $2e15/cm^{-2}$ to $4e15/cm^{-2}$.

14. A high-resistance polysilicon resistor formation method, the method comprising:
forming a first electrode in a NMOS region of a substrate;
forming a second electrode in a PMOS region of the substrate;
forming a polysilicon pattern in a high-resistance polysilicon resistor region of the substrate;
forming a first mask pattern to expose the first electrode and cover the second electrode and the polysilicon pattern;
performing a first ion implantation process to form a P-type well region under the first gate electrode with the first mask pattern on the NMOS region;
forming a second mask pattern to expose the second electrode, and cover the first electrode and the polysilicon pattern;
performing a second ion implantation process to form a N-type well region under the second gate electrode with the second mask pattern on the PMOS region;
forming a third mask pattern to completely expose the first electrode and the polysilicon pattern, and cover the second electrode;
performing a third ion implantation process to implant N-type dopants into the NMOS region and the high-resistance polysilicon resistor region, wherein N-type source and drain regions are formed in the P-type well region through the third ion implantation process;
forming a fourth mask pattern to completely expose the second gate electrode and the polysilicon pattern, and cover the first gate electrode; and
performing a fourth ion implantation process to implant P-type dopants into the PMOS region and the high-resistance polysilicon resistor region, wherein P-type source and drain regions are formed in the N-type well region by the fourth ion implantation process.

15. The method of claim 14, wherein the N-type dopants are implanted with an energy of 40 keV to 70 KEV at a concentration of $4e15/cm^{-2}$ to $7e15/cm^{-2}$.

16. The method of claim 14, wherein the P-type dopants are implanted with an energy of 4 keV to 10 KEV at a concentration of $2e15/cm^{-2}$ to $4e15/cm^{-2}$.

\* \* \* \* \*